(12) United States Patent
De Winter et al.

(10) Patent No.: US 8,426,088 B2
(45) Date of Patent: Apr. 23, 2013

(54) METHOD FOR A LITHOGRAPHIC APPARATUS

(75) Inventors: Laurentius Cornelius De Winter, Vessem (NL); Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/446,811

(22) Filed: Apr. 13, 2012

(65) Prior Publication Data

US 2012/0200838 A1   Aug. 9, 2012

Related U.S. Application Data

(62) Division of application No. 12/625,063, filed on Nov. 24, 2009, now Pat. No. 8,178, 263.

(60) Provisional application No. 61/193,419, filed on Nov. 26, 2008.

(51) Int. Cl.
*G03F 1/26* (2012.01)

(52) U.S. Cl.
USPC .................. 430/5; 430/396; 355/55; 355/67

(58) Field of Classification Search ................ 430/5, 30, 430/330, 396; 355/53, 55, 67
See application file for complete search history.

(56) References Cited

U.S. PATENT DOCUMENTS

| 7,316,870 | B2 | 1/2008 | Eurlings |
| 2005/0005257 | A1 | 1/2005 | Eurlings |
| 2008/0123066 | A1 | 5/2008 | Jansen |
| 2010/0129742 | A1 | 5/2010 | De Winter |

FOREIGN PATENT DOCUMENTS

| JP | 7-147222 | 6/1995 |
| JP | 8-148411 | 6/1996 |
| JP | 2001-284221 | 10/2001 |
| JP | 2004-343081 | 12/2004 |

OTHER PUBLICATIONS

Japanese Office Action mailed Nov. 2, 2011 in corresponding Japanese Patent Application No. 2009-263436.

*Primary Examiner* — Christopher Young

(74) *Attorney, Agent, or Firm* — Pillsbury Winthrop Shaw Pittman LLP

(57) ABSTRACT

A method of increasing a depth of focus of a lithographic apparatus is disclosed. The method includes forming diffracted beams of radiation using a patterning device pattern; and transforming a phase-wavefront of a portion of the diffracted beams into a first phase-wavefront having a first focal plane for the lithographic apparatus, and a second phase-wavefront having a second, different focal plane, wherein the transforming comprises: subjecting a phase of a first portion of a first diffracted beam and a phase of a corresponding first portion of a second diffracted beam to a phase change which results in an at least partial formation of the first phase-wavefront, and subjecting a phase of a second portion of the first diffracted beam and a phase of a corresponding second portion of the second diffracted beam to a phase change which results in an at least partial formation of the second phase-wavefront.

20 Claims, 9 Drawing Sheets

FIG. 4b  FIG. 4c

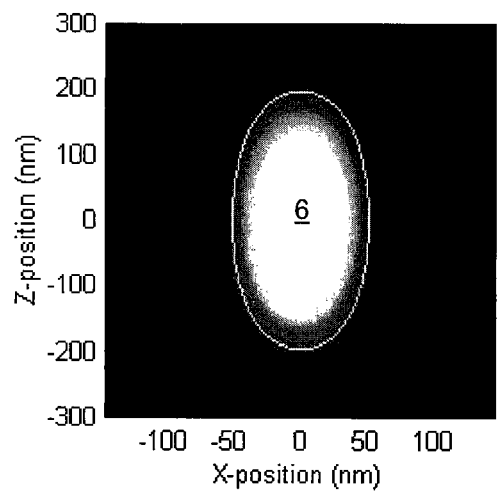
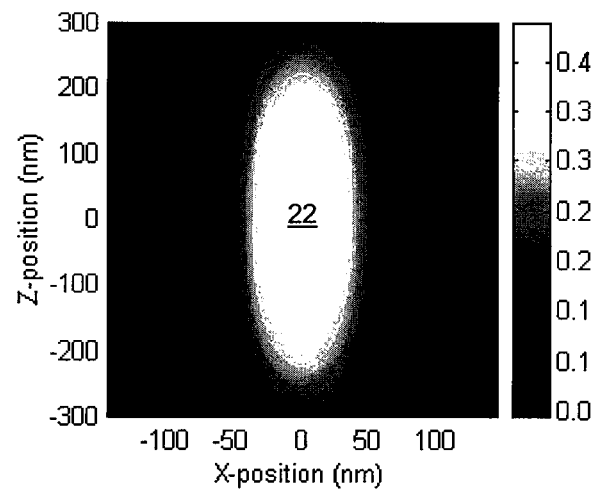
FIG. 8a
FIG. 8b
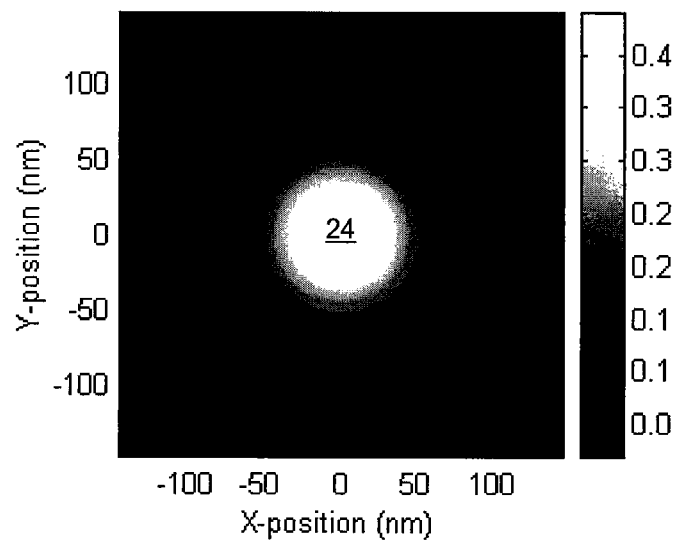
FIG. 9

METHOD FOR A LITHOGRAPHIC APPARATUS

This application is a divisional of U.S. patent application Ser. No. 12/625,063, filed Nov. 24, 2009 now U.S. Pat. No. 8,178,263, which claims priority and benefit under 35 U.S.C. §119(e) to U.S. Provisional Patent Application No. 61/193,419, filed on Nov. 26, 2008. The content of each foregoing application is incorporated herein in its entirety by reference.

FIELD

The present invention relates to a method of increasing the depth of focus of a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In the semiconductor manufacturing industry, there is an increasing demand for ever-smaller features and increased density of features. Critical dimensions (CDs) of pattern features are therefore rapidly decreasing, and are becoming very close to the theoretical resolution limit of state-of-the-art lithographic apparatus such as the steppers and scanners as described above. Conventional techniques for enhancing resolution and minimizing patternable critical dimension include: reducing the wavelength of the exposure radiation; increasing the numerical aperture of the projection system of the lithographic apparatus; and including features smaller than the resolution limit of the lithographic apparatus so that they will not be patterned onto the substrate, but so that they will produce diffraction effects which can improve contrast and sharpen fine features of patterns applied to the substrate. However, application of such conventional resolution enhancement techniques may lead to a reduction of depth of focus within which, for example, imaging of desired patterns at or near the limit of the resolution capability can be achieved. A reduced depth of focus may lead to pattern defects (for example, the blurring of lines or edges of pattern features) beyond tolerance when, for example, a residual substrate unflatness cannot be compensated for during exposure of the substrate.

It is desirable to provide, for example, a method and apparatus that obviates or mitigates one or more of the problems identified above, or one or more of the problems of the prior art in general, whether identified herein or elsewhere. For instance, it is desirable to provide a method and apparatus which increases the depth of focus of a pattern feature imaged by a lithographic apparatus.

SUMMARY

According to an aspect, there is provided a method of increasing a depth of focus of a pattern feature imaged by a lithographic apparatus, the method comprising: illuminating a patterning device pattern, provided by a patterning device, with a radiation beam, the patterning device pattern comprising a pattern feature that diffracts the radiation beam to form a plurality of diffracted beams of radiation, illuminating a phase modulation element with the diffracted beams of radiation emanating from the patterning device, and using the phase modulation element to control (e.g., transform) the phase of at least a portion of radiation constituting each of the diffracted beams of radiation to form a first phase-wavefront having a first focal plane (and a first depth of focus) for the lithographic apparatus, and a second phase-wavefront having a second focal plane (and a second depth of focus) for the lithographic apparatus, the first and second focal planes (and depths of focus) being offset relative to one another along an optical axis of the lithographic apparatus, wherein controlling (i.e. transforming) the phase of the radiation constituting at least a portion of the diffracted beams of radiation comprises: controlling (e.g., transforming) the phase of a first portion of a first diffracted beam of radiation and a corresponding first portion of a second diffracted beam of radiation so that the first portions of the first and second diffracted beams of radiation are subjected to a first phase change which results in an at least partial formation of the first phase-wavefront; and controlling (e.g., transforming) the phase of a second portion of the first diffracted beam of radiation and a corresponding second portion of the second diffracted beam of radiation so that the second portions of the first and second diffracted beams of radiation are subjected to a second phase change which results in an at least partial formation of the second phase-wavefront.

When the first and second phase-wavefronts combine to form an image on a radiation beam receiving element (e.g. a substrate, a detector, or the like) the depth of focus of the first and second phase-wavefronts will correspond to the combined images through focus to result in an increased depth of focus in comparison with the situation where no phase modulation was undertaken.

The radiation beam that illuminates the patterning device may comprise incoherent radiation. The radiation beam that illuminates the patterning device may have an illumination mode, the illumination mode having a single pole centered on an optical axis of the lithographic apparatus.

The patterning device pattern may be a contact hole pattern.

The first portions of the first and second diffracted beams of radiation and the second portions of the first and second diffracted beams of radiation may be corresponding in that they have the same relative position in each respective diffracted beam of radiation.

The first portion of the first or second diffracted beam of radiation and the second portion of the first or second diffracted beam of radiation may define substantially equal areas when projected onto the phase modulation element.

When projected onto the phase modulation element, the first and second portions of the first or second diffracted beam of radiation may meet at a center of the first or second diffracted beam of radiation.

Alternate and/or adjacent portions of each diffracted beam of radiation may be subjected to a phase change which results in the at least partial formation of alternate phase-wavefronts.

A phase of eight, sixteen or thirty two different portions of each diffracted beam of radiation may be controlled.

The first phase change may together define (or be defined by) a radial phase distribution. The second phase change may together define (or be defined by) a radial phase distribution.

The first phase-wavefront and second phase-wavefront may each have a different positive degree of curvature; or the first phase-wavefront and second phase-wavefront may each have a different negative degree of curvature; or the first phase-wavefront may have a positive degree of curvature and the second phase-wavefront may have a negative degree of curvature.

A phase change for the first portion of the first or second diffracted beam of radiation may be equal and opposite to a phase change of the second portion of the first or second diffracted beam of radiation There may be little or no overlap between the diffracted beams of radiation when incident upon the phase modulation element.

The phase modulation element may comprise a controllable region. The controllable region may be controllable to change a refractive index of the controllable region. The controllable region may be controllable by selectively heating the controllable region. The controllable region may be controllable by selectively controlling a shape, position or orientation of the controllable region.

The phase modulation element may be located at or adjacent to a pupil plane of the lithographic apparatus.

The first phase change or the second phase change may be a zero phase change.

According to an aspect, there is provided a method of increasing a depth of focus of a lithographic apparatus, the method comprising: forming diffracted beams of radiation by illuminating a patterning device pattern with a radiation beam, the patterning device pattern comprising a pattern feature that diffracts the radiation beam, illuminating a phase modulation element with the diffracted beams of radiation, and transforming a phase-wavefront of a portion of the diffracted beams of radiation into a first phase-wavefront having a first focal plane (and a first depth of focus) for the lithographic apparatus, and a second phase-wavefront having a second focal plane (and a second depth of focus) for the lithographic apparatus, the first and second focal planes (and first and second depths of focus) being offset relative to one another along an optical axis of the lithographic apparatus, wherein the transforming comprises: subjecting a phase of a first portion of a first diffracted beam of radiation and a phase of a corresponding first portion of a second diffracted beam of radiation to a phase change which results in an at least partial formation of the first phase-wavefront, and subjecting a phase of a second portion of the first diffracted beam of radiation and a phase of a corresponding second portion of the second diffracted beam of radiation to a phase change which results in an at least partial formation of the second phase-wavefront.

According to an aspect, there is provided a lithographic apparatus comprising a phase modulation element configured to control the phase of at least a portion of radiation constituting each of a plurality of diffracted beams of radiation from a patterning device to form a first phase-wavefront having a first focal plane for the lithographic apparatus, and a second phase-wavefront having a second focal plane for the lithographic apparatus, the first and second focal planes being offset relative to one another along an optical axis of the lithographic apparatus, wherein control of the phase of the radiation constituting at least a portion of the diffracted beams of radiation comprises: controlling the phase of a first portion of a first diffracted beam of radiation and a corresponding first portion of a second diffracted beam of radiation so that the first portions of the first and second diffracted beams of radiation are subjected to a first phase change which results in an at least partial formation of the first phase-wavefront, and controlling the phase of a second portion of the first diffracted beam of radiation and a corresponding second portion of the second diffracted beam of radiation so that the second portions of the first and second diffracted beams of radiation are subjected to a second phase change which results in an at least partial formation of the second phase-wavefront.

The lithographic apparatus may have, where appropriate, one or more of the features described above in relation to the methods described herein.

The controlling of the phase modulation element may be undertaken by a controller (e.g. a computer or the like).

The arrangement configured to combine the first phase-wavefront and the second phase-wavefront may be a lens arrangement.

According to an aspect, there is provided a device manufactured using the method or apparatus described herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4b and 4c schematically depict a first phase-wavefront and a second phase-wavefront, respectively;

FIG. 5a schematically depicts a part of the illumination mode shown in and described with reference to FIG. 2a;

FIG. 5c schematically depicts the depth of focus of the contact hole of FIG. 5b when imaged by the lithographic apparatus for the part of the illumination mode shown in and described with reference to FIG. 5a, when subjected to the phase distribution shown in and described with reference to FIG. 4a;

FIG. 6a schematically depicts another part of the illumination mode shown in and described with reference to FIG. 2a;

FIG. 6c schematically depicts the depth of focus of the contact hole of FIG. 6b when imaged by the lithographic apparatus for the part of the illumination mode shown in and described with reference to FIG. 6a, when subjected to the phase distribution shown in and described with reference to FIG. 4a;

FIG. 7a schematically depicts a complete illumination mode that is the combination of the parts of the illumination mode shown in and described with reference to FIGS. 5a and 6a;

FIG. 7c schematically depicts the combined depth of focus of the contact hole of FIG. 7b when imaged by the lithographic apparatus for the combined parts of the illumination mode shown in FIGS. 5a and 6a when subjected to the phase distribution shown in and described with reference to FIG. 4a;

FIG. 8a schematically depicts the depth of focus of a contact hole when imaged by the lithographic apparatus when the radiation constituting the illumination mode is not subjected to a phase change according to an embodiment of the present invention;

FIG. 8b schematically depicts the depth of focus of a contact hole when imaged by the lithographic apparatus when the radiation constituting the illumination mode is subjected to the phase modulation according to an embodiment of the present invention;

FIG. 9 schematically depicts a pattern formed, in an x-y plane (e.g. the plane of a radiation beam receiving element such as a detector or a substrate) when radiation constituting the illumination mode used to image the pattern was subjected to the phase modulation shown in and described with reference to FIG. 4a;

DETAILED DESCRIPTION

Figure 1:
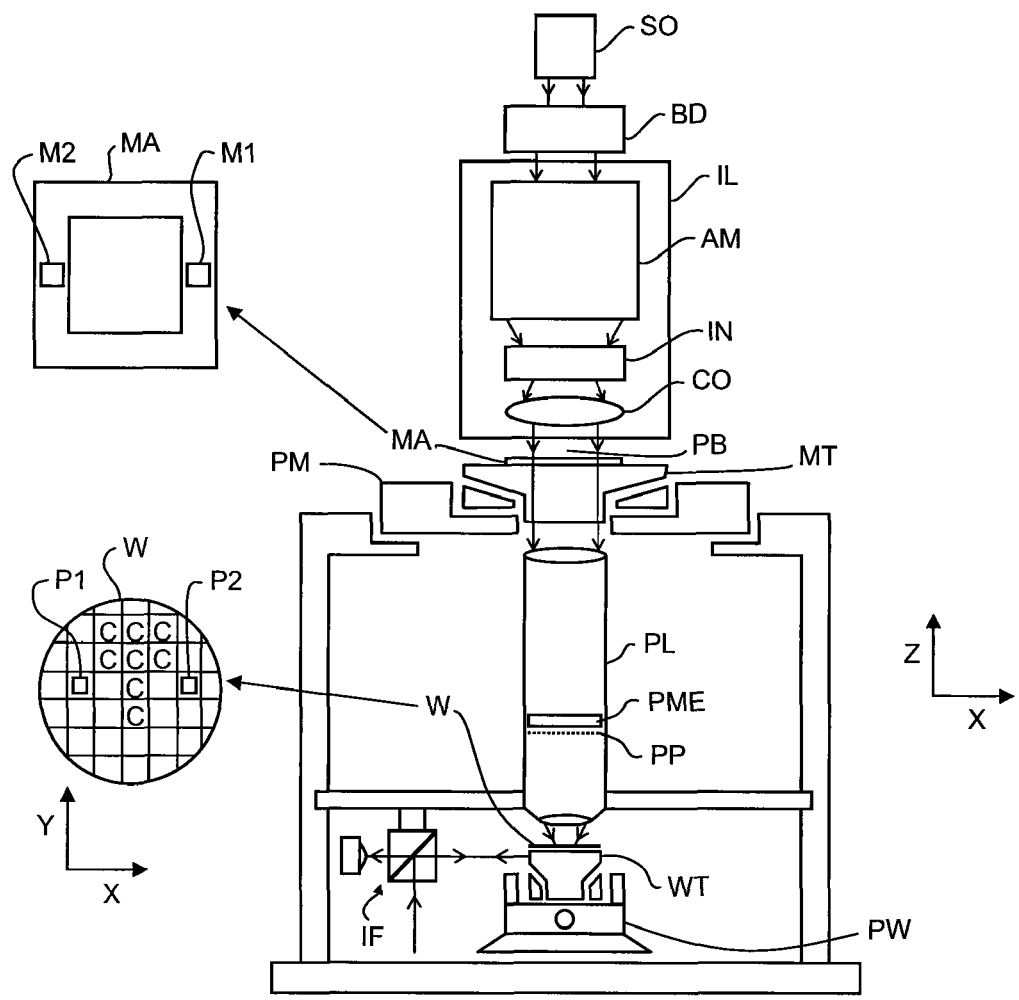
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit. Any use of the terms "reticle" or "mask" herein may be considered synonymous with the more general term "patterning device".

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

- an illumination system (illuminator) IL to condition a beam PB of radiation (e.g. UV radiation or EUV radiation);
- a support structure (e.g. a support structure) MT to support a patterning device (e.g. a mask) MA and connected to first positioning device PM to accurately position the patterning device with respect to item PL;
- a substrate table (e.g. a wafer table) WT to hold a substrate (e.g. a resist-coated wafer) W and connected to second positioning device PW to accurately position the substrate with respect to item PL;
- a projection system (e.g. a refractive projection lens) PL configured to image a pattern imparted to the radiation beam PB by patterning device MA onto a target portion C (e.g. comprising one or more dies) of the substrate W; and
- a phase modulation element PME located in or adjacent to a pupil plane PP of the projection system PL, the phase modulation element PME being arranged to adjust a phase of at least a part of an electric field of the radiation beam.

As here depicted, the apparatus is of a transmissive type (e.g. employing a transmissive mask). Alternatively, the apparatus may be of a reflective type (e.g. employing a programmable mirror array of a type as referred to above).

The support structure MT holds the patterning device. It holds the patterning device in a way depending on the orientation of the patterning device, the design of the lithographic apparatus, and other conditions, such as for example whether or not the patterning device is held in a vacuum environment. The support structure can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam (e.g. for providing a desired illumination made in the radiation beam). Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The illumination system may encompass various types of optical components, including refractive, reflective, and catadioptric optical components for directing, shaping, or controlling the beam of radiation, and such components may also be referred to herein, collectively or singularly, as a "lens".

The radiation beam PB is incident on the patterning device (e.g. mask) MA, which is held on the support structure MT. Having traversed the patterning device MA, the beam PB passes through the projection system PL, which focuses the beam onto a target portion C of the substrate W. In passing through the projection system PL, the beam PB also passes through the phase modulation element PME. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
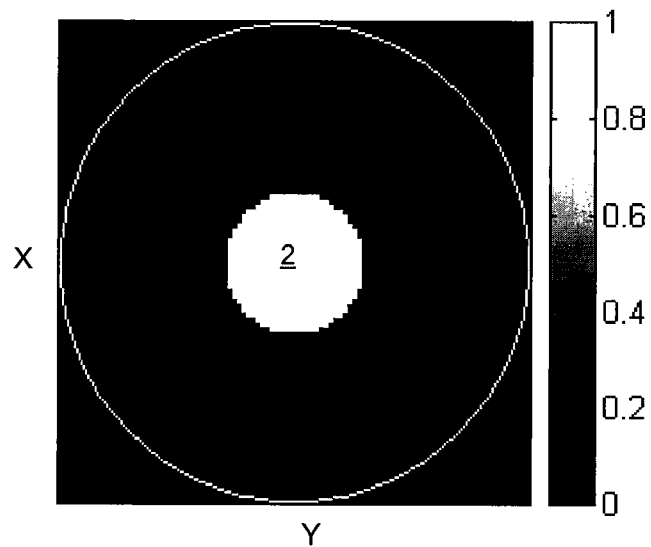
FIG. 2a schematically depicts an illumination mode.

FIG. 2a schematically depicts an illumination mode for use in, for example, applying a pattern to a substrate. The illumination mode may be created and used by, for example, the lithographic apparatus shown in and described with reference to FIG. 1. The illumination mode consists of a single pole 2 located on the optical axis of the lithographic apparatus. The illumination mode comprises radiation that is incoherent.

Figure 2B:
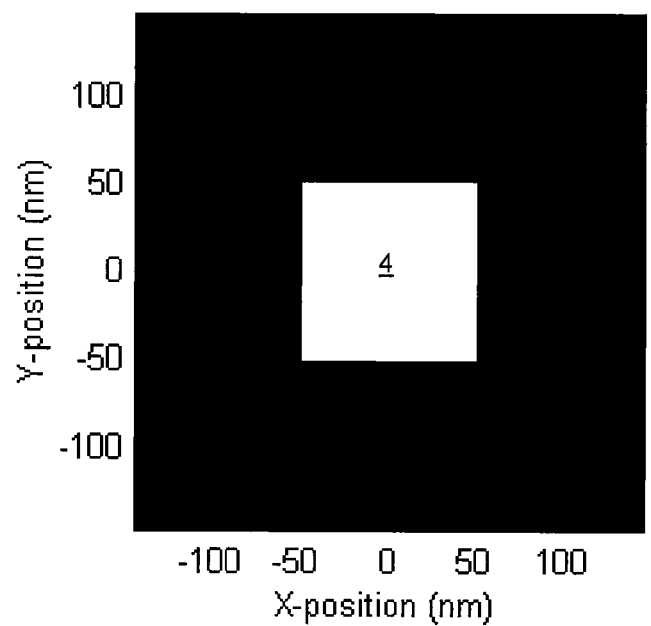
FIG. 2b schematically depicts a part of a contact hole pattern provided by a patterning device.

The illumination mode is used to illuminate a pattern provided by a patterning device, for example the patterning device shown in and described with reference to FIG. 1. FIG. 2b shows a part of the pattern provided by the patterning device. The part of the pattern is a 100 nm binary contact hole 4. It will be appreciated that FIG. 2b shows only one of the binary contact holes which would make up a whole contact hole pattern. The contact hole pattern may, as a whole, comprise a plurality of binary contact holes. The plurality of contact holes may have, for example, a pitch of 292 nm. The cross-sectional dimension of the (binary) contact hole, as well as the pitch of the contact holes, are given by way of example only.

Figure 2C:
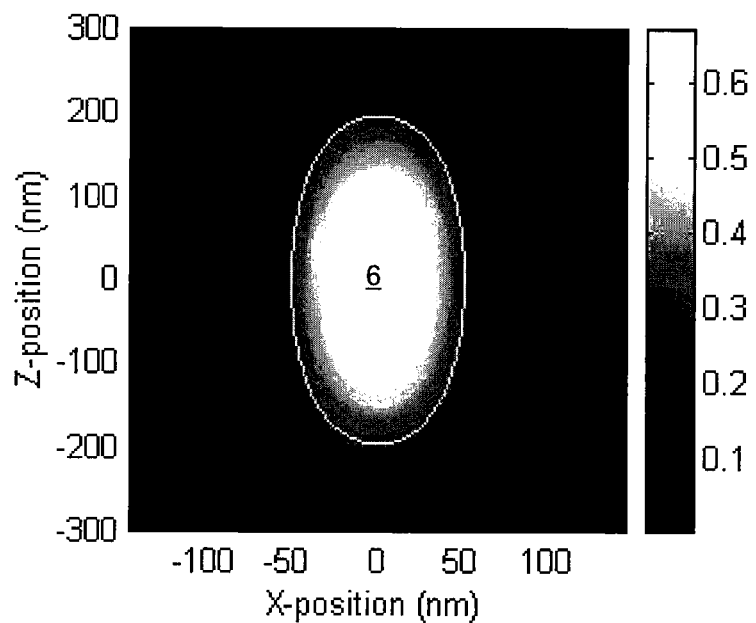
FIG. 2c schematically depicts a depth of focus when the contact hole of FIG. 2b is imaged by a lithographic apparatus.

FIG. 2c schematically depicts a depth of focus 6 of the lithographic apparatus used with the illumination mode shown in FIG. 2a to expose the pattern shown in FIG. 2b. It can be seen that a region of relatively uniform intensity extends along the z-direction (i.e. along the optical axis) for approximately 200 nm (i.e. between about −100 nm and +100 nm about a mid-point of maximum intensity).

As discussed above, it is desirable to increase the depth of focus of a lithographic apparatus (i.e. an image formed by a lithographic apparatus). Such an increase in the depth of focus may be desirable to counteract a resolution enhancement technique which may lead to a reduction in the depth of focus. Alternatively or additionally, an increase in the depth of focus may be desirable to increase the range over which imaging of a desired pattern at or near the limit of the resolution capability can be achieved. Such an increase in the depth of focus may, therefore, be desirable even if the depth of focus has not been reduced by a resolution enhancement technique.

According to an embodiment of the present invention, the depth of focus of a lithographic apparatus (i.e. an image formed by a lithographic apparatus) may be increased by modulating (i.e. controlling) the phase of one or more portions of one or more diffracted beams of radiation that are diffracted by the pattern provided by the patterning device. In particular, the phase of one or more corresponding portions of the diffracted beams of radiation (i.e. having the same relative position in respective diffracted beams when projected onto the phase modulation element) may be subjected to a first phase change which results in those corresponding parts combining to form a phase-wavefront having a desired shape. This phase-wavefront will have a first depth of focus (i.e. a first focal plane). Other corresponding portions of the diffracted radiation beams may be subjected to a second phase change to help ensure that those parts combine to form a second, different phase-wavefront. The second phase-wavefront has a second, different, depth of focus (i.e. a second focal plane) to the first phase-wavefront. When the first and second phase-wavefronts combine to form an image on a radiation beam receiving element (e.g. a substrate, a detector, or the like) the depth of focus of both phase-wavefronts will correspond to the combined images through focus to result in an increased depth of focus in comparison with the situation where no phase modulation was undertaken.

A method according to an embodiment of the present invention will now be described with reference to FIGS. 3 to 11.

Figure 3:
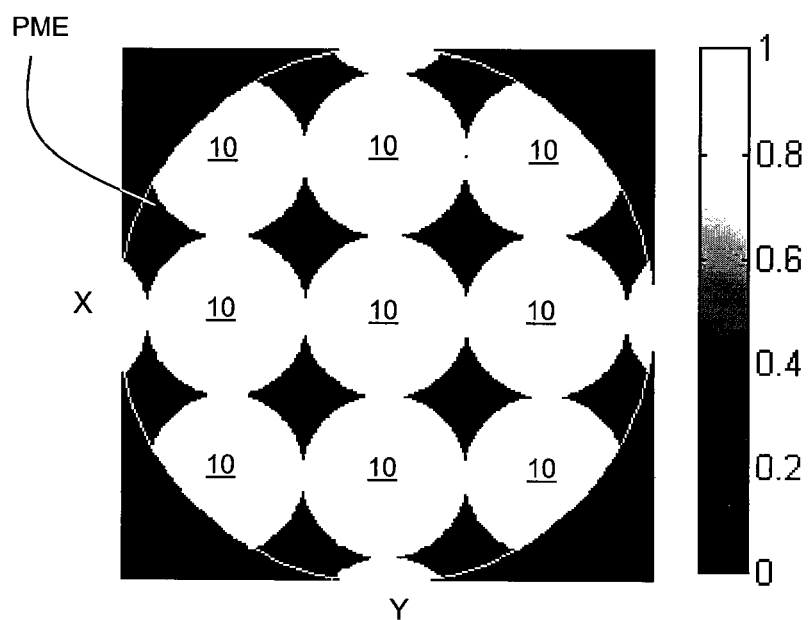
FIG. 3 schematically depicts a distribution of diffracted radiation on a phase modulation element that is located at or adjacent to a pupil plane of a projection system of the lithographic apparatus.

FIG. 3 schematically depicts the distribution of diffracted beams of radiation 10 that are incident upon the phase modulation element PME shown in and described with reference to FIG. 1. Specifically, FIG. 3 depicts the footprint (i.e. the projection of) the diffracted beams of radiation 10 on the phase modulation element PME. The diffracted beams of radiation 10 are generated as the radiation constituting the illumination mode has passed through, along, between or around (or been reflected off) the pattern provided by the patterning device, and in doing so being diffracted by the pattern provided by the patterning device.

Figure 4A:
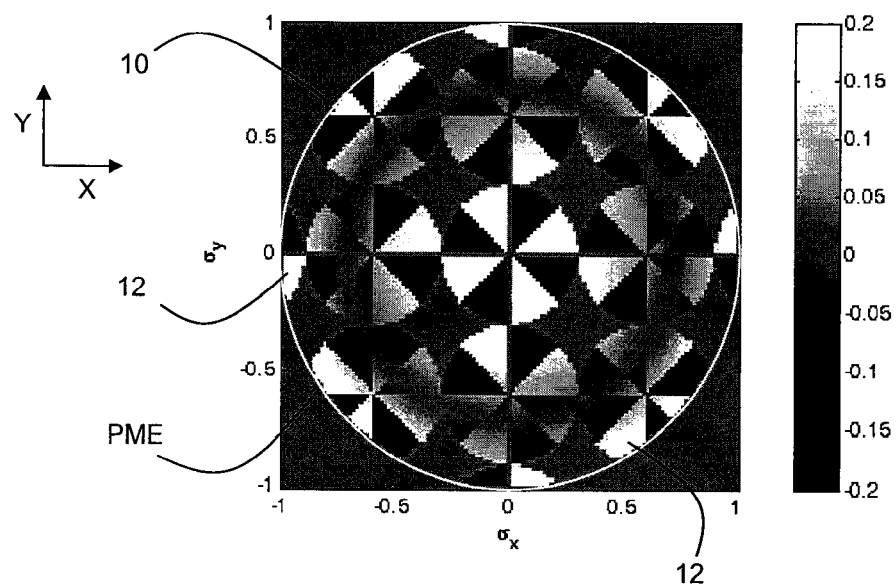
FIG. 4a schematically depicts a phase distribution provided by the phase modulation element in accordance with an embodiment of the present invention, in relation to the diffracted radiation shown in and described with reference to FIG. 3.

The phase modulation element PME is transmissive, although in another embodiment, the phase modulation element may be reflective. The phase modulation element PME comprises a plurality of controllable transmissive regions (discussed in more detail below in relation to FIGS. 10 and 11). The refractive index of each region can be individually controlled to effectively control (i.e. modulate) the phase of radiation passing through that particular region. FIG. 4a shows how such a phase modulation element PME can be used to independently control different parts of each of the diffracted beams of radiation.

FIG. 4a shows the diffracted beams of radiation 10 together with the phase modulation applied to each portion 12 of each of the diffracted beams of the radiation 10 by different regions of the phase modulation element PME. It can be seen from FIG. 4a that each of the diffracted beams of radiation 10 is, where incident upon the phase modulation element PME, divided into eight different portions 12. Each of the eight portions 12 are circular sectors of equal area. The portions 12 are circular sectors due to the footprint of the diffracted beams being substantially circular in shape. The portions 12 may have shapes other than circular sectors. Each diffracted beam may be divided into greater or fewer than eight portions.

Alternating and adjacent portions 12 have their phase controlled (i.e. transformed) to ensure that after passing through the phase modulation element the portions combine to form one of two different phase-wavefronts. This may be achieved by mapping the required phase onto a desired wavefront. For example, of the eight portions 12 of each diffracted beam, the first, third, fifth and seventh portions may have their phase controlled such that they combine to form at least a part of (i.e. are mapped onto) a first phase-wavefront, for example the first phase-wavefront 14 shown in two-dimensions in FIG. 4b. Referring back to FIG. 4a, the second, fourth, sixth and eighth portions of the eight portions 12 of each diffracted beam may have their phase controlled such that they combine to form at least a part of (i.e. are mapped onto) a second phase-wavefront, for example the second phase-wavefront 16 shown in two-dimensions in FIG. 4c. Referring back to FIG. 4a, corresponding portions of different diffracted beams of radiation (i.e. having the same relative position in respective diffracted beams when projected onto the phase modulation element) have their phase controlled such that they combine to form at least a part of (i.e. are mapped onto) the same phase-wavefront as each other. Alternating (e.g. first and second) portions have their phase controlled such that they combine to form at least a part of (i.e. are mapped onto) alternate (e.g. first and second) phase-wavefronts. Alternating portions that are mapped onto alternate phase-wavefronts may be repeated within, and/or around a center of, each diffracted beam of radiation.

Referring to FIG. 4a, it can be seen that the division of the diffracted beams into eight portions of equal area creates an eight-fold symmetry. Such symmetry means that areas mapped onto a first phase-wavefront are not adjacent to areas mapped onto a second phase-wavefront. As will be discussed below, this helps ensure that there is no astigmatism in an image formed by the combination and imaging of the diffracted beams of radiation (and thus the two different phase-wavefronts) on a radiation beam receiving element (e.g. a substrate or the like). This means that the phase modulation does not result in a displacement or distortion of the image in the x-y plane (i.e. the plane onto which the image is projected).

Figure 4D:
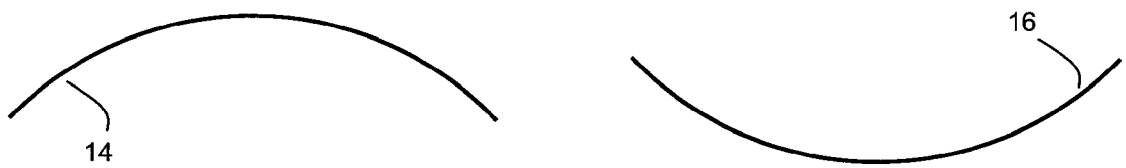
FIG. 4d schematically depicts the phase distribution, in general, provided by the phase modulation element in accordance with an embodiment of the present invention.
Figure 4D:
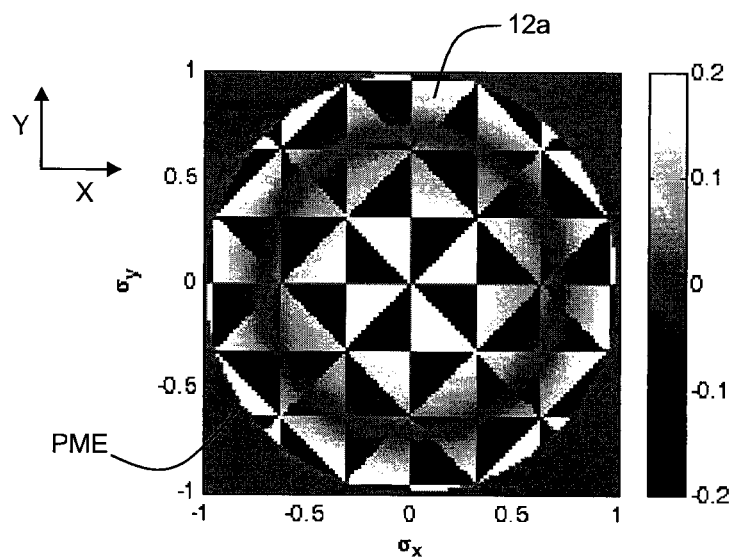

FIG. 4a shows the phase distribution provided by the phase modulation element overlaid on top of the diffracted beams of radiation. FIG. 4d is a more generic depiction of the phase distribution of the phase modulation element PME. The effect of this phase distribution is no different to that shown in and described with reference to FIG. 4a. It can be seen that in practice the phase modulation may extend across an area of the phase modulation element that does not just include those areas onto which diffracted beams of radiation are incident. In order to divide the diffracted beams of radiation into different portions, regions 12a of the phase modulation element are appropriately controlled to cause a desired phase change in those portions to map the portions onto different wavefronts. One or more adjacent regions may be associated with the formation of a first wavefront (i.e. to control the phase of a first portion of a diffracted beam). One or more adjacent regions may be associated with the formation of a second wavefront (i.e. to control the phase of a second portion of a diffracted beam). Individually controllable regions of the phase modulation element may not have a shape which corresponds to the shape of a portion of the footprint of a diffracted beam when incident on the phase modulation element. Instead, a plurality of individually controllable regions of the phase modulation element may, together, have a shape which corresponds to the shape of a portion of the footprint of a diffracted beam when incident on the phase modulation element.

It can be seen in FIGS. 4a and 4d that the regions of the phase modulation element which are associated with the formation of a given phase-wavefront are not located adjacent to one another. Specifically, it can be seen that a side of a region associated with the formation of a first phase-wavefront is not adjacent to a side of another region also associated with the formation of that first phase-wavefront. Corners or vertices of the regions may, however, be adjacent to one another. Since the regions of the phase modulation element control the phase of portions of the diffracted beams of radiation, it will also be appreciated that portions of the diffracted beams of radiation which are incident on the phase modulation element and which form a given phase-wavefront are not located adjacent to one another. Specifically, it can be seen in FIG. 4a that a side of a footprint of a portion of a diffracted beam of radiation which is incident on the phase modulation element and which forms at least a part of a given phase-wavefront is not adjacent to a side of another portion which forms at least a part of that first phase-wavefront. The result of this is that there is little or no astigmatism in an image formed using the phase-wavefronts. These principles are generally applicable, and are not limited to, for example, the shapes of the phase modulation element regions, diffracted beams, and portions of those diffracted beams shown in FIGS. 4a and 4d. For example, in principle any distribution of the illumination radiation into areas of equal size can be used, where the corresponding diffraction orders of these areas experience two (or more) different wavefronts. To avoid distortions in a resultant image, such as astigmatism, however, the areas of the diffracted beams may be equal in the x axis and/or y-axis and desirably also in the diagonal direction (relative to the x and y axes). This may be achieved by dividing the illumination radiation into eight portions, or sixteen portions, or thirty two portions, etc.

Phase-wavefronts having different shapes will, after passing through a focusing optical system, have different focal points and possibly also different depths of focus which are located at different points along an optical axis. The first and second phase-wavefronts described above will have first and second focal planes and substantially equal depths of focus. According to an embodiment of the present invention, the different focal planes of the two different phase-wavefronts are taken advantage of. Upon focusing of the two different phase-wavefronts, images formed by the two different phase-wavefronts combine to create an increased overall depth of focus for the lithographic apparatus.

Figure 5A:
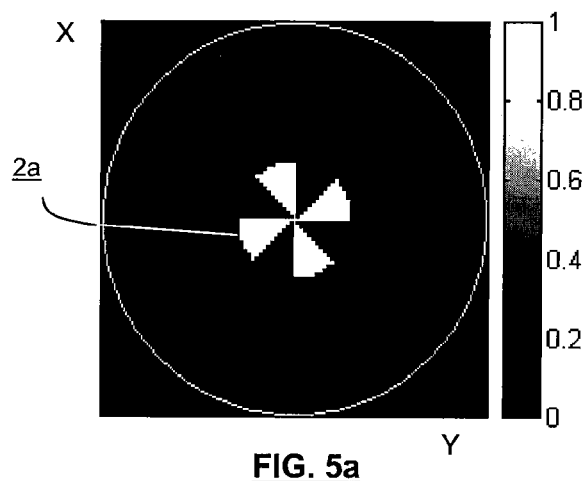
Figure 5B:
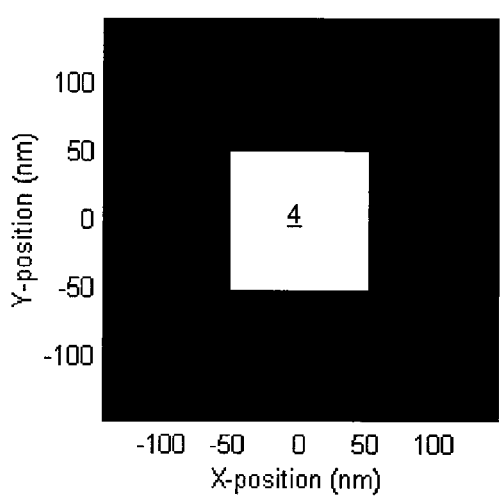
FIG. 5b schematically depicts a part of a contact hole pattern provided by a patterning device.
Figure 5C:
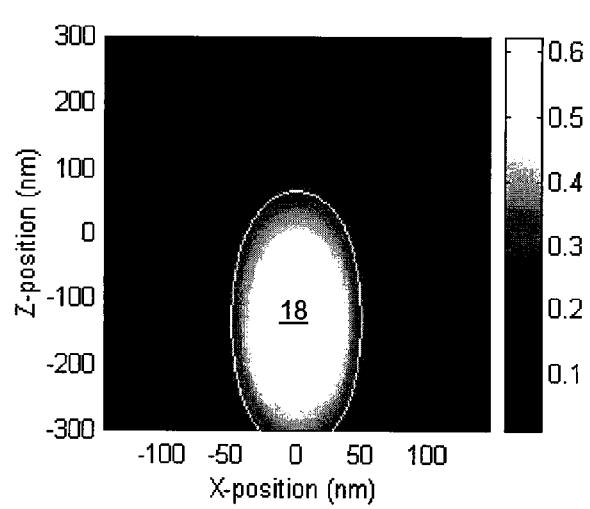
Figure 6A:
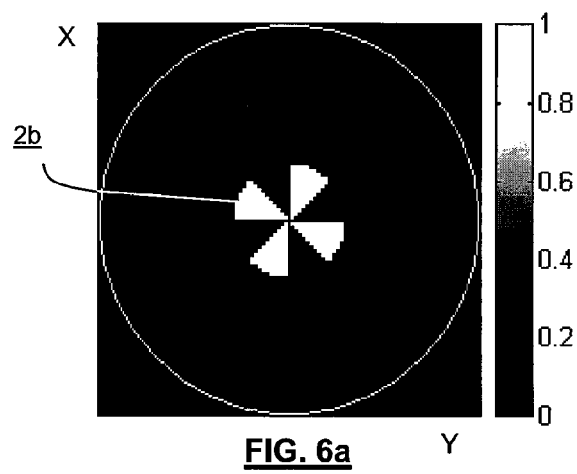
Figure 6B:
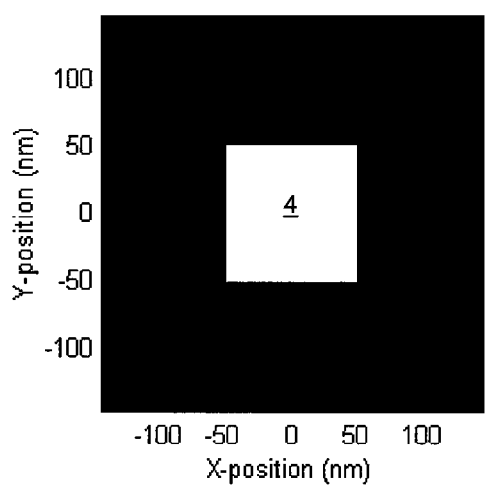
FIG. 6b schematically depicts a part of a contact hole pattern provided by a patterning device.
Figure 6C:
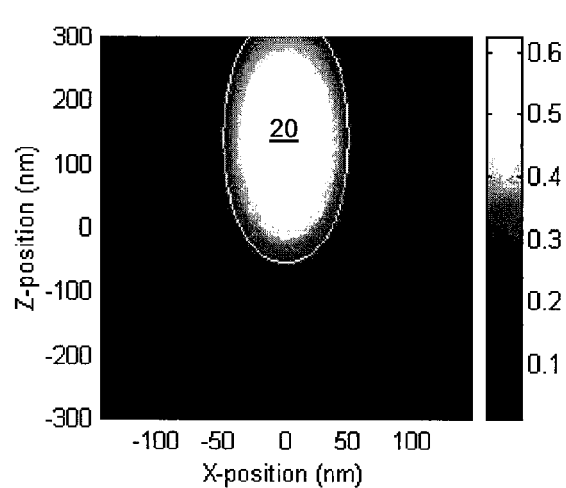

FIGS. 5a-c will be used to explain what happens to radiation constituting a first portion of radiation constituting the illumination mode when subjected to the phase modulation discussed above. FIGS. 6a-6c will be used to explain what happens to radiation constituting a second portion of radiation constituting the illumination mode when subjected to the phase modulation discussed above.

FIG. 5a shows a first portion 2a of radiation constituting the illumination mode shown in and described with reference to FIG. 2a. It will be understood that FIG. 5a does not, in any way, depict a different illumination mode to that shown in and described with reference to FIG. 2a. Instead, FIG. 5a is simply depicting a first portion 2a of radiation forming the illumination mode that is incident upon the patterning device. The first portion of radiation 2a shown in FIG. 5a is divided into four circular sectors that are separated from one another and equally spaced from one another. The distribution of the circular sectors corresponds, at least in part, to the distribution of circular sectors discussed above in relation to the phase distribution provided by the phase modulation element.

FIG. 5b shows a part of the contact hole pattern 4 illuminated by the first portion of radiation shown in and described with reference to FIG. 5a.

The first portion of radiation shown in FIG. 5a will, after being diffracted by the pattern of the patterning device, be incident upon the phase modulation element provided with the phase distribution shown in FIGS. 4a and 4d. The first portion of radiation shown in FIG. 5a will therefore form corresponding portions in the diffracted beams of radiation that are incident on the phase modulation element, and which have their phase controlled such that the diffracted portions are mapped onto a first phase-wavefront.

FIG. 5c shows that this first phase-wavefront has a first depth of focus 18. The first depth of focus 18 has a range of substantially uniform intensity which extends approximately 200 nm in the z-direction (i.e. along the optical axis). Due to the phase change introduced by the phase modulation element, it can be seen that the first depth of focus in FIG. 5c is displaced in the negative z-direction by approximately 150 nm in comparison with the depth of focus shown in and described with reference to FIG. 2c (for which the radiation beam was not subjected to a phase change).

FIG. 6a shows a second portion 2b of radiation constituting the illumination mode shown in and described with reference to FIG. 2a. It will be understood that FIG. 6a does not, in any way, depict a different illumination mode to that shown in and described with reference to FIG. 2a. Instead, FIG. 6a is simply depicting a second portion of radiation 2b forming the illumination mode that is incident upon the patterning device. The second portion of radiation 2b shown in FIG. 6a is divided into four circular sectors that are separated from one another and equally spaced from one another. The distribution of the circular sectors corresponds, at least in part, to the distribution of circular sectors discussed above in relation to the phase distribution provided by the phase modulation element. In this embodiment, the circular sectors of the second portion of radiation 2b are at locations that are alternating between the circular sectors of the first portion of radiation 2a.

FIG. 6b shows a part of the contact hole pattern 4 illuminated by the second portion of radiation shown in and described with reference to FIG. 6a.

The second portion of radiation shown in FIG. 6a will, after being diffracted by the pattern of the patterning device, be incident upon the phase modulation element provided with the phase distribution shown in FIGS. 4a and 4d. The second portion of radiation shown in FIG. 6a will therefore form corresponding portions in the diffracted beams of radiation that are incident on the phase modulation element, and which have their phase controlled such that the diffracted portions are mapped onto a second phase-wavefront.

FIG. 6c shows that this second phase-wavefront has a second depth of focus 20. The second depth of focus 20 has a range of substantially uniform intensity which extends approximately 200 nm in the z-direction (i.e. along the optical axis). Due to the phase change introduced by the phase modulation element, it can be seen that the second depth of focus in FIG. 6c is displaced in the positive z-direction by approximately 150 nm in comparison with the depth of focus shown in and described with reference to FIG. 2c (for which the radiation beam was not subjected to a phase change).

In practice, it will be appreciated that the first and second portions of radiation forming the illumination mode will illuminate the patterning device and phase modulation element in combination. The first and second portions of radiation forming the illumination mode will initially constitute a single beam of radiation, and after being diffracted will constitute different portions of the diffracted beams of radiation. This means that the different depths of focus (associated with different phase-wavefronts) shown in and described with reference to FIGS. 5c and 6c will not be independent of one another, but will instead combine to result in an increased depth of focus. This is shown schematically in FIGS. 7a-7c.

Figure 7A:
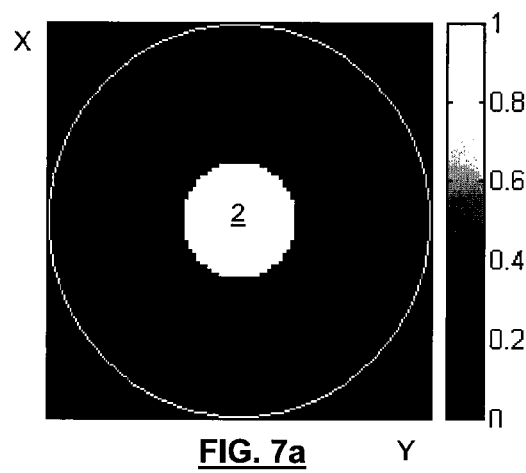

FIG. 7a shows an illumination mode 2 used to illuminate a pattern provided by a patterning device. The illumination mode 2 comprises radiation having the combined distribution of the first and second portions of radiation shown in FIGS. 5a and 6a. The illumination mode 2 consists of a single pole 2 centered on the optical axis of the lithographic apparatus. The illumination mode of FIG. 7a is thus the same as the illumination mode shown in and described with reference to FIG. 4a.

Figure 7B:
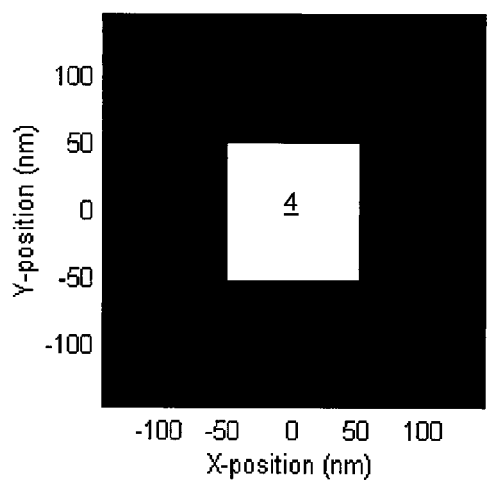
FIG. 7b schematically depicts a part of a contact hole pattern provided by a patterning device.

FIG. 7b shows a part of a contact hole 4 pattern which is illuminated by the illumination mode shown in and described with reference to FIG. 7a. The part of a contact hole 4 pattern shown in FIG. 7b is the same as the part of the contact hole pattern shown in and described with reference to FIG. 4b. Radiation constituting the illumination mode shown in FIG. 7a will diffract off, around, along and/or between (or reflect from) the pattern 2 provided by the patterning device and will be diffracted as shown in and described with reference to FIG. 3. The phases of different portions of the diffracted beams of radiation will then be controlled using the phase modulation element as shown in and described with reference to FIGS. 4a-4d. The control of the phase may involve controlling the refractive index of adjacent and alternate regions of the phase modulation element upon which portions of the diffracted beams of radiation are incident. The control of the phase is such that different portions of these diffracted beams are subjected to a phase change which results in the formation of two different phase-wavefronts. The two different phase-wavefronts have two different depths of focus as discussed above in relation to FIGS. 5c and 6c.

Figure 7C:
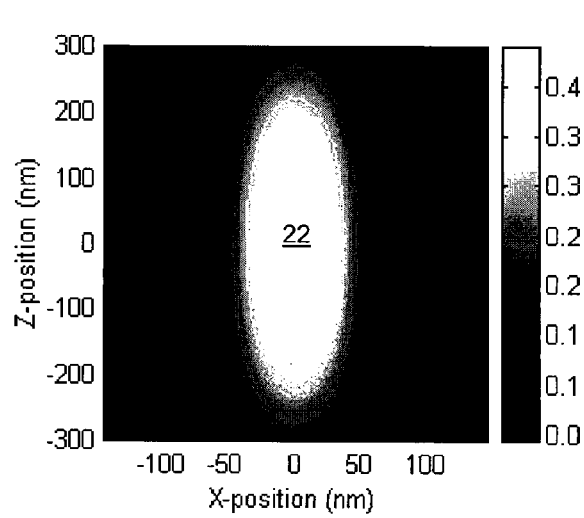

FIG. 7c schematically depicts a combined depth of focus 22. The combined depth of focus 22 is a combination of the two different images through focus which result from the focusing of the two different phase-wavefronts discussed above (i.e. the combination of the depths of focus shown in and described with reference to FIGS. 5c and 6c). It can be seen that the combined depth of focus 22 has a region of substantially constant intensity extending over a range of about 400 nm in the z-direction (i.e. along the optical axis). Thus, it can be seen that the depth of focus is significantly increased when using the method according to an embodiment of the present invention. This is seen more clearly in FIGS. 8a and 8b.

FIG. 8a shows the depth of focus 6 of a contact hole imaged by a lithographic apparatus for which no phase change has been undertaken for diffracted radiation beams. FIG. 8b shows the depth of focus 22 of a contact hole imaged by a lithographic apparatus for which a phase change has been undertaken in accordance with an embodiment of the present invention as described above. FIGS. 8a and 8b in combination show that by using a method according to an embodiment of the present invention, the depth of focus has been approximately doubled (i.e. from about 200 nm to about 400 nm).

FIG. 9 schematically depicts an image 24 formed according to an embodiment of the present invention on a radiation beam receiving element (for example, a substrate, a detector, or the like). It can be seen that the image is centered in the x-y plane (i.e. the plane of the radiation beam receiving element on which the radiation beam is received). The phase modulation referred to above has not resulted in any significant shifting or distortion of (i.e. astigmatism in) the image in the x-y plane. No astigmatism is present because of the eight-fold symmetry discussed in more detail above.

In order to determine the phase change that should be introduced in the various different portions of the various different diffracted beams of radiation, desired first and second different phase-wavefronts are defined, or alternatively, phase distributions that result in such desired phase-wavefronts are defined. For instance, the first and second phase-wavefronts (or in other words focus-fronts) can be expressed in or defined by spherical Zernikes, as is known in the art. Other radial phase distributions may be used. One phase-wavefront may be positive in nature, and the other wavefront negative in nature. This means that one wavefront will have a positive degree of curvature, and the other wavefront a negative degree of curvature. Of course, other phase-wavefronts are possible. For example, one or both phase-wavefronts may have a different positive or different negative curvature, thus resulting in depths of focus located at different points along the optical axis. One of the two phase-wavefronts may have no curvature, and radiation that will form that phase-wavefront may not be subjected to a phase change. It will be appreciated that more than two different phase-wavefronts can be formed, for example, three, four, five or more phase-wavefronts, each phase-wavefront having a different focal plane.

An increased depth of focus may be achieved by ensuring that the different phase-wavefronts are curved, one phase-wavefront having a negative degree of curvature and one phase-wavefront having a positive degree of curvature. Adjacent and/or alternate portions of each diffracted beam may be subjected to equal but opposite phase changes (e.g. +x and −x). This results in a maximum possible combined depth of focus when the two phase-wavefronts are combined. This embodiment may also be desirable if the phase modulation element can induce a positive or negative phase change in radiation passing through the phase modulation element. This is because the maximum possible phase change will be from a negative maximum to a positive maximum, and this will be larger (approximately double) the phase change range from zero to a positive or a negative maximum.

In the above embodiments, the portions of the footprints of the diffracted radiation beams have been described as being circular sectors. FIG. 4c shows that the regions may in practice be, for example, triangles. Other shapes are also possible, for example squares or rectangles. The embodiments are also not limited to the division of each diffracted beam into eight portions. For instance, each diffracted beam may be divided into greater or fewer than eight portions. Desirably, the number, and/or shape, and/or size, and/or arrangement of the portions are such that an image formed using the diffracted beams of radiation exhibits little or no astigmatism. Desirably, the diffraction of the radiation constituting the illumination mode is such that there is little or no overlap between the diffracted beams of radiation when incident upon the phase modulation element. This allows the phase of different portions of different diffracted beams of radiation to be independently controlled.

An embodiment of the present invention is particularly applicable to increasing the depth of focus of at least a part of a pattern feature (e.g. a contact hole) imaged by a lithographic apparatus having a patterning device that provides a contact hole pattern. This is because such patterns have a relatively uniform diffraction pattern in a pupil plane of a projection system of a lithographic apparatus. Such uniform distribution allows the phase of different portions of the diffracted beams of radiation to be accurately and independently controlled. The pattern provided by the patterning device may be or comprise a contact hole pattern. The contact hole pattern may be a staggered hole contact pattern. Other patterns may be provided, such as for example a rotated 'brickwall' pattern. In general, the pattern provided may be or comprise repetitive structures. The structures may have a limited depth of focus.

The illumination mode used may comprise of a single pole located on the optical axis. However, other point-symmetric illumination modes may be used, for instance those that are symmetric in either the x-axis, the y-axis, or along a diagonal (relative to the x and y axes) with respect to the Figures described herein. Such illumination modes include, for example, annular, quasar, quadrupole and asymmetric quasar or quadrupole illumination modes.

The radiation source may provide coherent and/or incoherent radiation. For coherent imaging an increased depth of focus for a contact hole can be obtained by, for example, transforming the phase of parts of the radiation beam into a phase-wavefront that consists of a positive and negative curved part (e.g. in a similar manner to that described above).

As will be appreciated for the embodiments described above, in order to realize the advantages of an embodiment of the present invention a phase modulation element is used. The phase modulation element may be configured so that certain parts of the phase modulation element are arranged to change the phase of certain parts of one or more components of a radiation beam incident upon (and/or passing through) the phase modulation element. The configuration may be actively controlled or be passively provided (e.g. pre-set) in the phase modulation element. The phase modulation may be undertaken by appropriate control of the configuration of, for example, a transmissive phase modulation element or of a reflective phase modulation element (e.g. a flexible mirrored surface or a mirrored surface comprising an array of moveable mirrored facets or the like).

Figure 10:
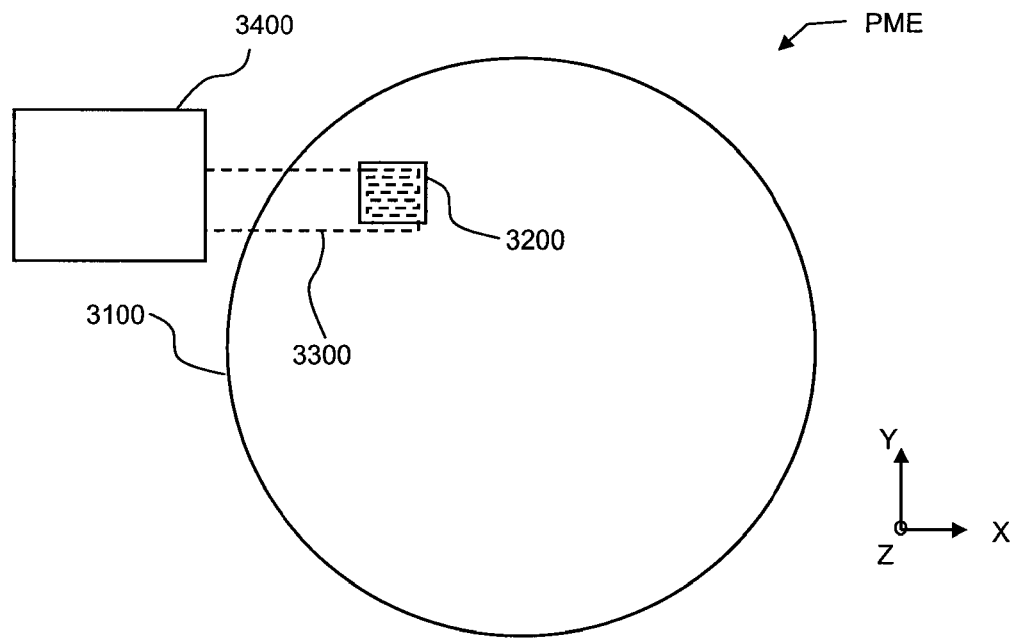
FIG. 10 schematically depicts a more detailed view of an embodiment of the phase modulation element shown in and/or described with reference to FIGS. 1 to 9.
Figure 11:
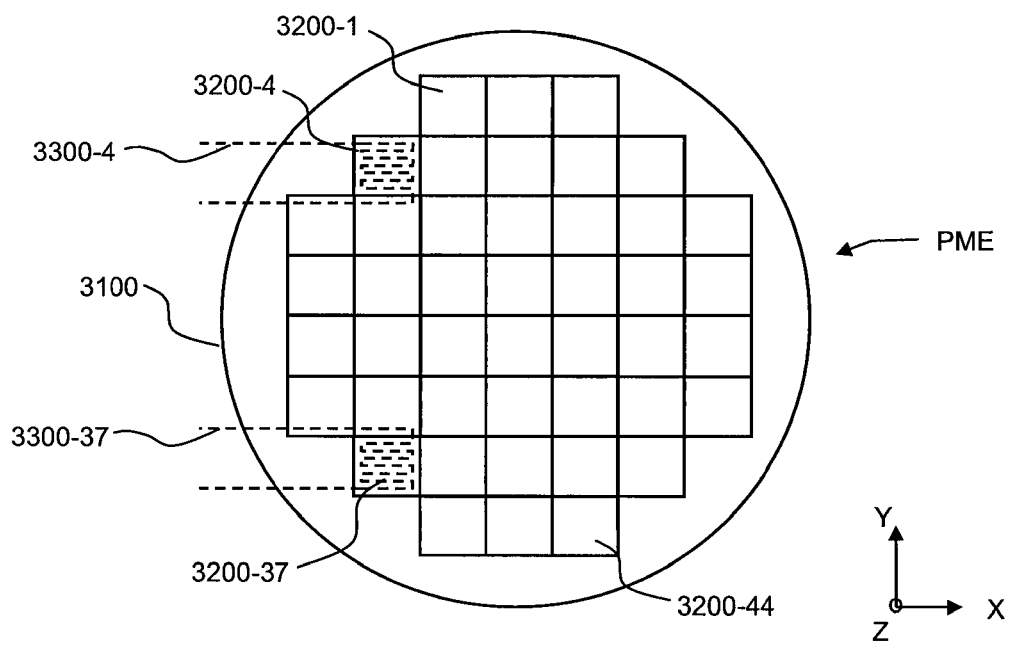
FIG. 11 schematically depicts further detail of the embodiment of the phase modulation element shown in and described with reference to FIG. 10.

FIGS. 10 and 11 depict specific embodiments of a suitable phase modulation element. The phase modulation element PME may comprise an optical element 3100 formed from material substantially transmissive for radiation constituting the radiation beam used in the lithographic apparatus. The phase modulation element may also comprise, or be in connection with, a controller 3400. An optical path length for a wave traversing the optical element 3100 is adjustable in response to a signal provided by the controller 3400. The optical element 3100 may be disposed, for example, in a Fourier transform plane (e.g. a pupil plane) of, for example, the projection system of the lithographic apparatus. Such a location would mean that, in use, the optical element 3100 is traversed by radiation emanating from the patterning device. An adjustment (i.e. control or modulation) of a phase of a wave traversing the optical element 3100 may be achieved by applying heat to a region 3200 of the optical element 3100, thereby introducing a local change in the index of refraction of material constituting the optical element relative to the refractive index of material adjacent to and surrounding the region 3200. The application of heat may be achieved by, for example, transmitting an electrical current through a wire 3300 having Ohmic resistance and being arranged in contact with the region 3200 of the optical element 3300. The controller 3400 is arranged to provide the (correct level of) current to the wire 3300 to achieve a desired change in the refractive index of the region 3200 and therefore modulation of the phase of the wave passing through the region 3200.

A plurality of, for example, adjacent portions of the optical element 3100 may be provided with a corresponding plurality of wires for heating one, more, or all regions 3200 of the optical element 3100 independently from any other region 3200. FIG. 11 schematically depicts an example of such an arrangement. FIG. 11 shows the optical element 3100. Adjacent regions 3200-1 up to 3200-44 are disposed in adjacent rows and, in the Figure, from left to right and from top to bottom. Each region 3200 of the regions 3200-1 up to 3200-44 is provided with a corresponding heating wire 3300-1 up to 3300-44. FIG. 11 schematically depicts only a few of these heating wires 3300-1 up to 3300-44 for clarity, although it will be understood that heating wires would in practice be provided for each or a plurality of the regions 3200-1 up to 3200-44.

The controller 3400 is constructed and arranged so that each or a plurality of wires 3300-1 to 3300-44 can be current-activated independently. This enables application of a spatial phase distribution to one or more optical waves (e.g. diffracted beams derived from radiation forming an illumination mode traversing the optical element 3100. As discussed above, in accordance with an embodiment of the present invention this spatial phase distribution may be used to manipulate specific portions of one or more diffracted beams radiation passing through the phase modulation element in order to, for example, increase the depth of focus of the lithographic apparatus.

It will be appreciated that the phase modulation element may be formed from or comprise any suitable number or regions, and that the number is not necessarily limited to 44. The number of regions may, in general, depend on a desired special resolution of phase change that is required in the lithographic apparatus. For example, a ratio of the area of each of the regions of the phase modulation element to the size of a clear area in the pupil plane may be between 100 and 1000. The regions have been shown in FIG. 10 and FIG. 11 as being substantially square or rectangular in shape. However, the regions may have other shapes, and may be, for example, triangular, pentagonal, hexagonal, circular or elliptical in shape. Other embodiments of a phase modulation element can be seen in, for example, US patent application publication no. US 2008-0123066. Instead of using a plurality of transmissive regions to control the phase of one or more portions of one or more radiation beams, a plurality of moveable mirrors could be used.

In an embodiment, there is provided a method of increasing a depth of focus of at least a part of a pattern feature imaged by a lithographic apparatus, the method comprising: illuminating a patterning device pattern, provided by a patterning device, with a radiation beam, the patterning device pattern comprising a pattern feature that diffracts the radiation beam to form a plurality of diffracted beams of radiation; illuminating a phase modulation element with the diffracted beams of radiation emanating from the patterning device, and using the phase modulation element to control the phase of at least a portion of radiation constituting each of the diffracted beams of radiation to form a first phase-wavefront having a first focal plane for the lithographic apparatus, and form a second phase-wavefront having a second focal plane for the lithographic apparatus, the first and second focal planes being offset relative to one another along an optical axis of the lithographic apparatus, wherein controlling the phase of the radiation constituting at least a portion of the diffracted beams of radiation comprises: controlling the phase of a first portion of a first diffracted beam of radiation and a corresponding first portion of a second diffracted beam of radiation so that the first portions of the first and second diffracted beams of radiation are subjected to a first phase change which results in an at least partial formation of the first phase-wavefront, and controlling the phase of a second portion of the first diffracted beam of radiation and a corresponding second portion of the second diffracted beam of radiation so that the second portions of the first and second diffracted beams of radiation are subjected to a second phase change which results in an at least partial formation of the second phase-wavefront.

In an embodiment, the first portions of the first and second diffracted beams of radiation and the second portions of the first and second diffracted beams of radiation are corresponding in that they have the same relative position in each respective diffracted beam of radiation. In an embodiment, the first portion of the first or second diffracted beam of radiation and the second portion of the first or second diffracted beam of radiation define substantially equal areas when projected onto the phase modulation element. In an embodiment, when projected onto the phase modulation element, the first and second portions of the first or second diffracted beam of radiation meet at a center of the respective first or second diffracted beam of radiation. In an embodiment, alternate and/or adjacent portions of each diffracted beam of radiation are subjected to a phase change which results in the at least partial formation of alternate phase-wavefronts. In an embodiment, a phase of eight, sixteen or thirty two different portions of each diffracted beam of radiation is controlled. In an embodiment, the first phase change together defines a radial phase distribution, or the second phase change together defines a radial phase distribution. In an embodiment, the first phase-wavefront and second phase-wavefront each have a different positive degree of curvature; or the first phase-wavefront and second phase-wavefront each have a different negative degree of curvature; or the first phase-wavefront has a positive degree of curvature and the second phase-wavefront has a negative degree of curvature. In an embodiment, a phase change of the first portion of the first or second diffracted beam of radiation is substantially equal and opposite to a phase change of the second portion of the first or second diffracted beam of radiation. In an embodiment, there is little or no overlap between the first and second diffracted beams of radiation when incident upon the phase modulation element, or wherein there is little or no overlap between the plurality of diffracted beams of radiation when incident upon the phase modulation element. In an embodiment, the phase modulation element comprises a controllable region. In an embodiment, the controllable region is controllable to change a refractive index of the controllable region. In an embodiment, the controllable region is controllable by selectively heating the controllable region. In an embodiment, the controllable region is controllable by selectively controlling a shape, position or orientation of the controllable region. In an embodiment, the phase modulation element is located at or adjacent to a pupil plane of the lithographic apparatus. In an embodiment, the first phase change is a zero phase change or the second phase change is a zero phase change.

In an embodiment, there is provided a method of increasing a depth of focus of at least a part of a pattern feature imaged by a lithographic apparatus, the method comprising: forming diffracted beams of radiation by illuminating a patterning device pattern with a radiation beam, the patterning device pattern comprising a pattern feature that diffracts the radiation beam; and illuminating a phase modulation element with the diffracted beams of radiation, and transforming a phase-wavefront of a portion of the diffracted beams of radiation into a first phase-wavefront having a first focal plane (and a first depth of focus) for the lithographic apparatus, and a second phase-wavefront having a second focal plane (and a second depth of focus) for the lithographic apparatus, the first and second focal planes (and first and second depths of focus) being offset relative to one another along an optical axis of the lithographic apparatus, wherein the transforming comprises: subjecting a phase of a first portion of a first diffracted beam of radiation and a phase of a corresponding first portion of a second diffracted beam of radiation to a phase change which results in an at least partial formation of the first phase-wavefront, and subjecting a phase of a second portion of the first diffracted beam of radiation and a phase of a corresponding second portion of the second diffracted beam of radiation to a phase change which results in an at least partial formation of the second phase-wavefront.

In an embodiment, there is provided a lithographic apparatus comprising: a phase modulation element configured to control the phase of at least a portion of radiation constituting each of a plurality of diffracted beams of radiation from a patterning device to form a first phase-wavefront having a first focal plane for the lithographic apparatus, and a second phase-wavefront having a second focal plane for the lithographic apparatus, the first and second focal planes being offset relative to one another along an optical axis of the lithographic apparatus, wherein control of the phase of the radiation constituting at least a portion of the diffracted beams of radiation comprises: controlling the phase of a first portion of a first diffracted beam of radiation and a corresponding first portion of a second diffracted beam of radiation so that the first portions of the first and second diffracted beams of radiation are subjected to a first phase change which results in an at least partial formation of the first phase-wavefront, and controlling the phase of a second portion of the first diffracted beam of radiation and a corresponding second portion of the second diffracted beam of radiation so that the second portions of the first and second diffracted beams of radiation are subjected to a second phase change which results in an at least partial formation of the second phase-wavefront. In an embodiment, the lithographic apparatus further comprises a patterning device provided with a patterning device pattern and arranged to receive a radiation beam, the patterning device pattern comprising a pattern feature arranged to diffract the radiation beam to form the plurality of diffracted beams of radiation.

While specific embodiments of the invention have been described above, it will be appreciated that the invention may be practiced otherwise than as described. The description is not intended to limit the invention, the invention being limited by the claims that follow.

The invention claimed is:

1. A lithographic apparatus comprising:
a phase modulation element configured to control the phase of at least a portion of radiation constituting each of a plurality of diffracted beams of radiation from a patterning device to form a first phase-wavefront having a first focal plane for the lithographic apparatus, and a second phase-wavefront having a second focal plane for the lithographic apparatus, the first and second focal planes being offset relative to one another along an optical axis of the lithographic apparatus, wherein control of the phase of the radiation constituting at least a portion of the diffracted beams of radiation comprises:
control of the phase of a first portion of a first diffracted beam of radiation and a corresponding first portion of a second diffracted beam of radiation so that the first portions of the first and second diffracted beams of radiation are subjected to a first phase change which results in an at least partial formation of the first phase-wavefront, and
control of the phase of a second portion of the first diffracted beam of radiation and a corresponding second portion of the second diffracted beam of radiation so that the second portions of the first and second diffracted beams of radiation are subjected to a second phase change which results in an at least partial formation of the second phase-wavefront.

2. The lithographic apparatus of claim 1, further comprising the patterning device provided with a patterning device pattern and arranged to receive a radiation beam, the patterning device pattern comprising a pattern feature arranged to diffract the radiation beam to form the plurality of diffracted beams of radiation.

3. The lithographic apparatus of claim 1, wherein the first portions of the first and second diffracted beams of radiation and the second portions of the first and second diffracted beams of radiation are corresponding in that they have the same relative position in each respective diffracted beam of radiation.

4. The lithographic apparatus of claim 1, wherein the first portion of the first or second diffracted beam of radiation and the second portion of the first or second diffracted beam of radiation define substantially equal areas when projected onto the phase modulation element.

5. The lithographic apparatus of claim 1, wherein, when projected onto the phase modulation element, the first and second portions of the first or second diffracted beam of radiation meet at a center of the respective first or second diffracted beam of radiation.

6. The lithographic apparatus of claim 1, wherein alternate and/or adjacent portions of each diffracted beam of radiation are subjected to a phase change which results in the at least partial formation of alternate phase-wavefronts.

7. The lithographic apparatus of claim 1, wherein a phase of eight, sixteen or thirty two different portions of each diffracted beam of radiation is controlled.

8. The lithographic apparatus of claim 1, wherein the first phase change together defines a radial phase distribution, or the second phase change together defines a radial phase distribution.

9. The lithographic apparatus of claim 1, wherein:
the first phase-wavefront and second phase-wavefront each have a different positive degree of curvature; or
the first phase-wavefront and second phase-wavefront each have a different negative degree of curvature; or
the first phase-wavefront has a positive degree of curvature and the second phase-wavefront has a negative degree of curvature.

10. The lithographic apparatus of claim 1, wherein a phase change of the first portion of the first or second diffracted beam of radiation is substantially equal and opposite to a phase change of the second portion of the first or second diffracted beam of radiation.

11. The lithographic apparatus of claim 1, wherein there is little or no overlap between the first and second diffracted beams of radiation when incident upon the phase modulation element, or wherein there is little or no overlap between the plurality of diffracted beams of radiation when incident upon the phase modulation element.

12. The lithographic apparatus of claim 1, wherein the phase modulation element comprises a controllable region.

13. The lithographic apparatus of claim 12, wherein the phase modulation element is configured to change a refractive index of the controllable region, to selectively heat the controllable region, or to selectively control a shape, position or orientation of the controllable region.

14. The lithographic apparatus of claim 1, wherein the first phase change is a zero phase change or the second phase change is a zero phase change.

15. A lithographic apparatus comprising:
a phase modulation element configured to transform a phase-wavefront of a portion of a plurality of diffracted beams of radiation into a first phase-wavefront having a first focal plane for the lithographic apparatus, and a second phase-wavefront having a second focal plane for the lithographic apparatus, the first and second focal planes being offset relative to one another along an optical axis of the lithographic apparatus, wherein transformation of the phase-wavefront comprises:
application of a first phase change to a first portion of a first diffracted beam of radiation and to a corresponding first portion of a second diffracted beam of radiation, which results in an at least partial formation of the first phase-wavefront, and
application of a second phase change to a second portion of the first diffracted beam of radiation and to a corresponding second portion of the second diffracted beam of radiation, which results in an at least partial formation of the second phase-wavefront.

16. The lithographic apparatus of claim 15, wherein the first portions of the first and second diffracted beams of radiation and the second portions of the first and second diffracted beams of radiation are corresponding in that they have the same relative position in each respective diffracted beam of radiation.

17. The lithographic apparatus of claim 15, wherein, when projected onto the phase modulation element, the first and second portions of the first or second diffracted beam of radiation meet at a center of the respective first or second diffracted beam of radiation.

18. The lithographic apparatus of claim 15, wherein the first phase change is a zero phase change or the second phase change is a zero phase change.

19. A lithographic apparatus comprising:
a projection system configured to project a first diffracted beam of radiation and a second diffracted radiation beam; and
a phase modulation element configured to at least partly form a first phase-wavefront having a first focal plane for the lithographic apparatus from a first portion of the first diffracted beam of radiation and from a corresponding first portion of the second diffracted beam of radiation and to at least partly form a second phase-wavefront having a second focal plane for the lithographic apparatus from a second portion of the first diffracted beam of radiation and from a corresponding second portion of the second diffracted beam of radiation, the first and second focal planes being offset relative to one another along an optical axis of the lithographic apparatus.

20. The lithographic apparatus of claim 19, wherein the first portions of the first and second diffracted beams of radiation and the second portions of the first and second diffracted beams of radiation are corresponding in that they have the same relative position in each respective diffracted beam of radiation.

* * * * *